United States Patent [19]

Kaucic

[11] Patent Number: 4,746,015

[45] Date of Patent: May 24, 1988

[54] ADJUSTABLE CIRCUIT BOARD HOLDER ASSEMBLY

[75] Inventor: Edward M. Kaucic, Watertown, Wis.

[73] Assignee: Menasha Corporation, Neenah, Wis.

[21] Appl. No.: 876,775

[22] Filed: Jun. 20, 1986

[51] Int. Cl.⁴ .............................................. H05K 1/18
[52] U.S. Cl. .................... 206/334; 206/509; 220/225; 361/415
[58] Field of Search .............. 206/334, 509, 518; 220/22.5, 22.2, 22.4; 361/415; 211/41

[56] References Cited

U.S. PATENT DOCUMENTS

| | | | |
|---|---|---|---|
| 3,767,058 | 10/1973 | Barlow et al. | 211/41 |
| 3,845,359 | 10/1974 | Fedele | 317/101 DH |
| 4,184,599 | 1/1980 | Drake et al. | 211/41 |
| 4,462,499 | 7/1984 | Calabro | 211/41 |
| 4,527,222 | 7/1985 | Swingley, Jr. | 361/415 |

Primary Examiner—Joseph Man-Fu Moy
Attorney, Agent, or Firm—Quarles & Brady

[57] ABSTRACT

A printed circuit board holder assembly which is readily adaptable to being used in tote boxes for automatic handling of the circuit boards. The holder assembly is infinitely adjustable with respect to the circuit boards so as to permit precise position holding for robotic handling. The holder assembly includes an end cap slide member which is held in a restrained manner with respect to a slotted face plate and a movable cap body to which is attached a divider plate for holding the printed circuit board. In one embodiment, a threaded shaft is carried by the cap body engages threads on the cap slide member to effect incremental adjustment of the divider plate with respect to the circuit board. In another embodiment, a ratchet arrangement is provided between the cap slide member and the movable cap body to effect the incremental adjustment.

18 Claims, 4 Drawing Sheets

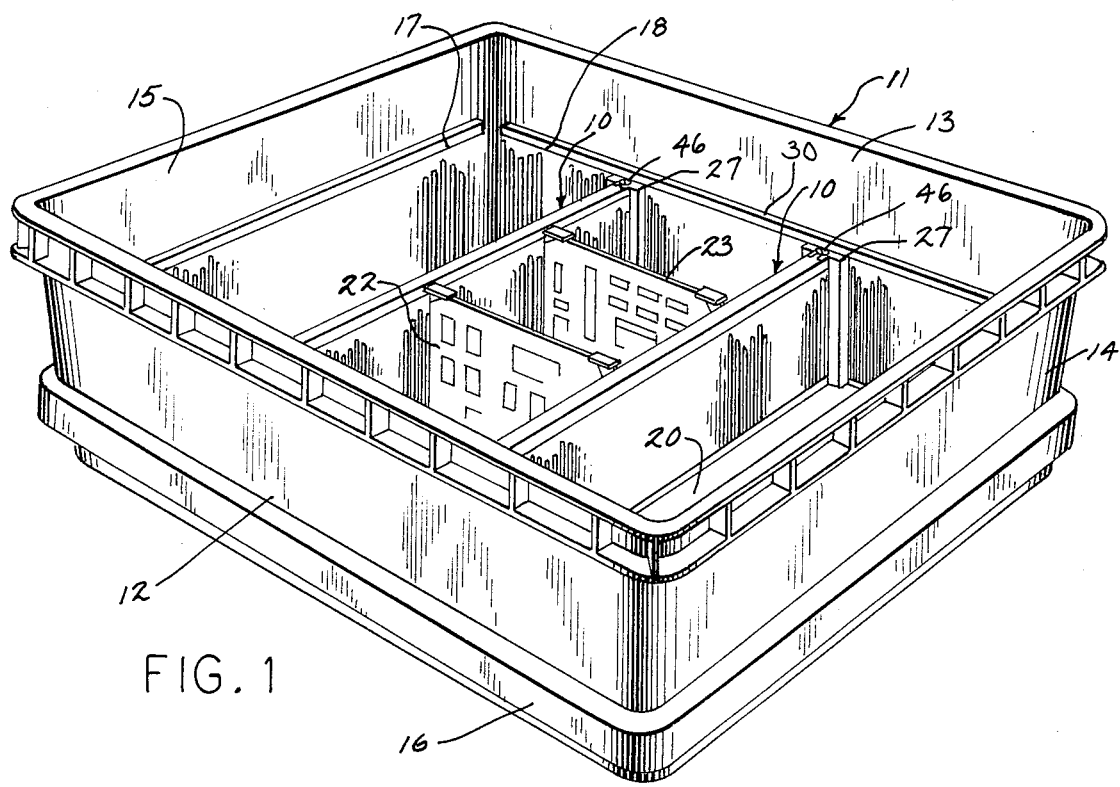
FIG. 1
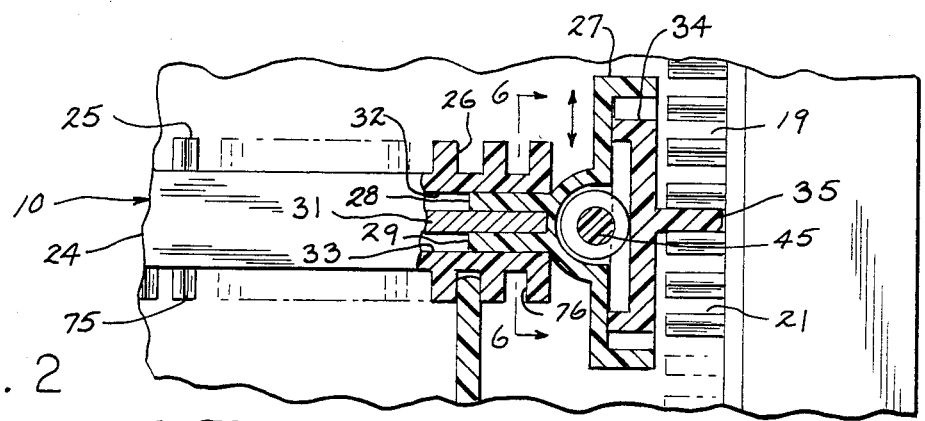
FIG. 2
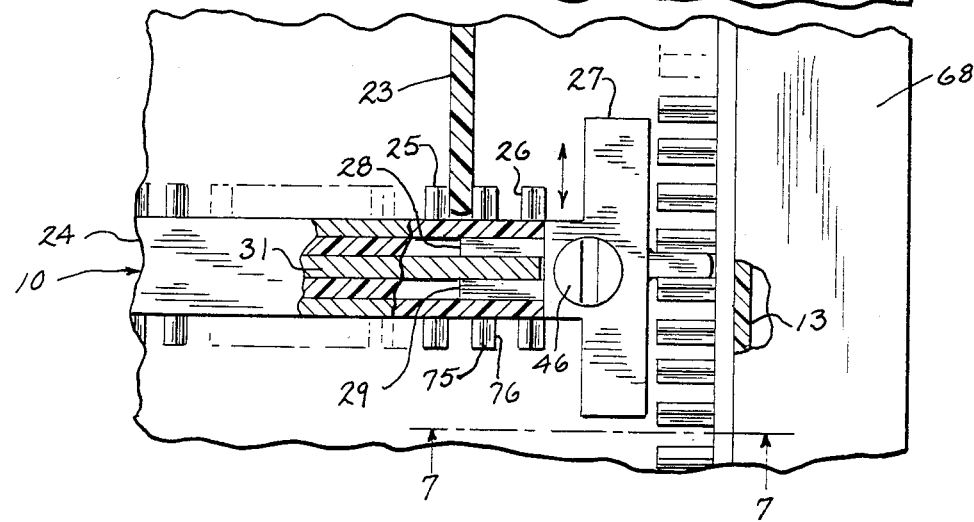

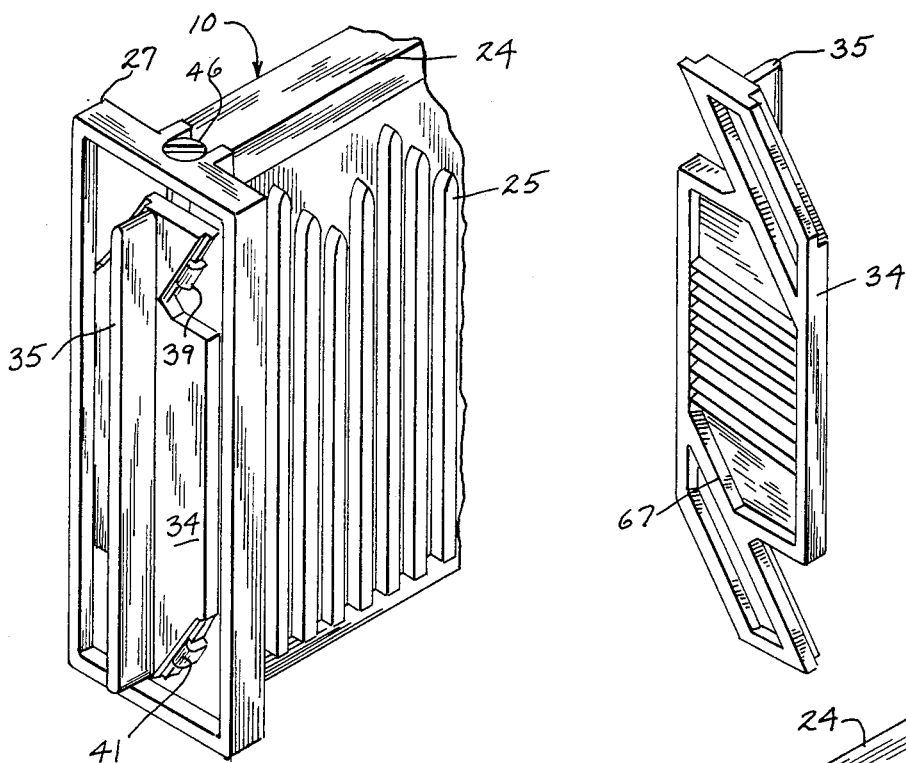
FIG. 3
FIG. 4
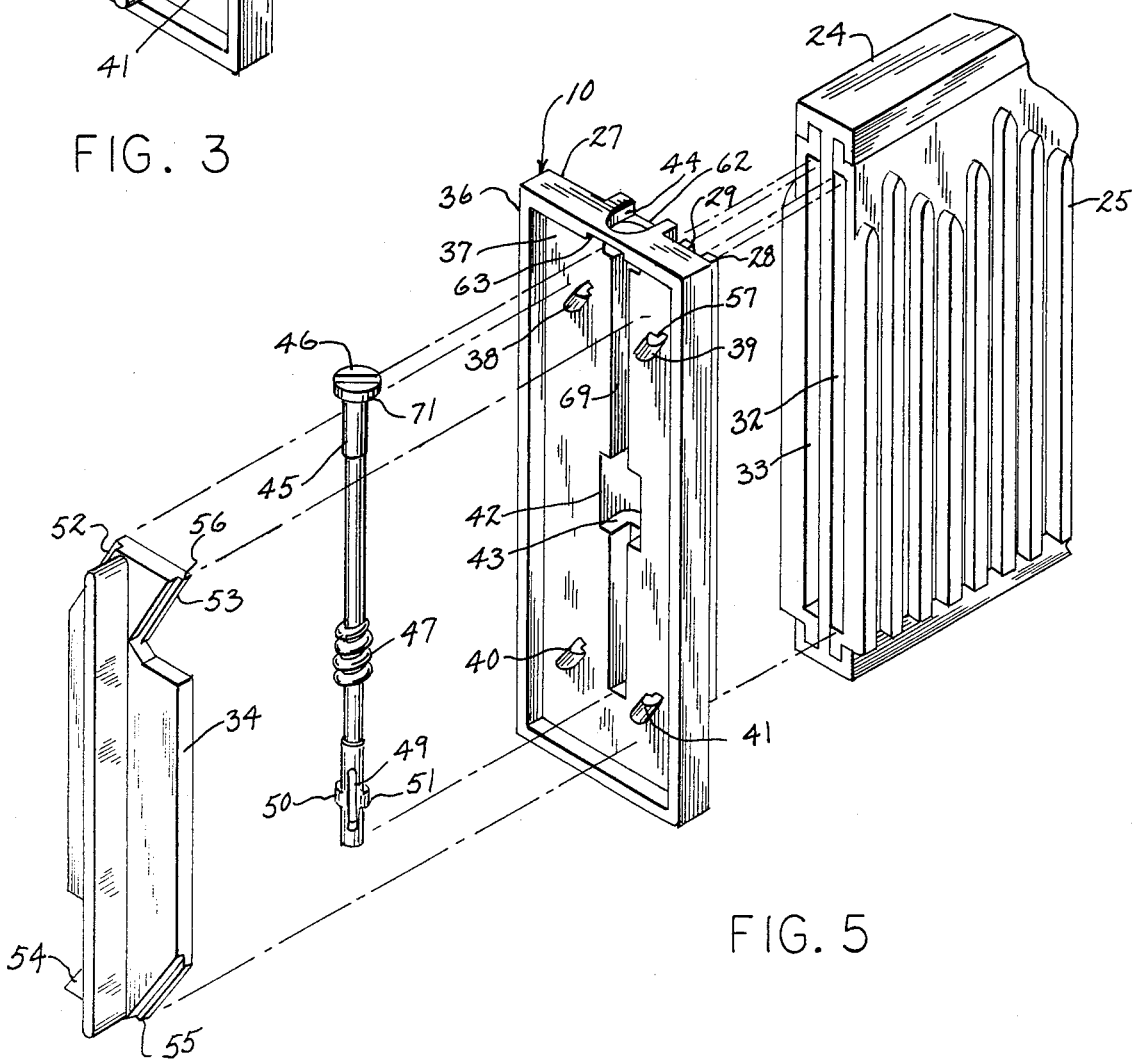
FIG. 5

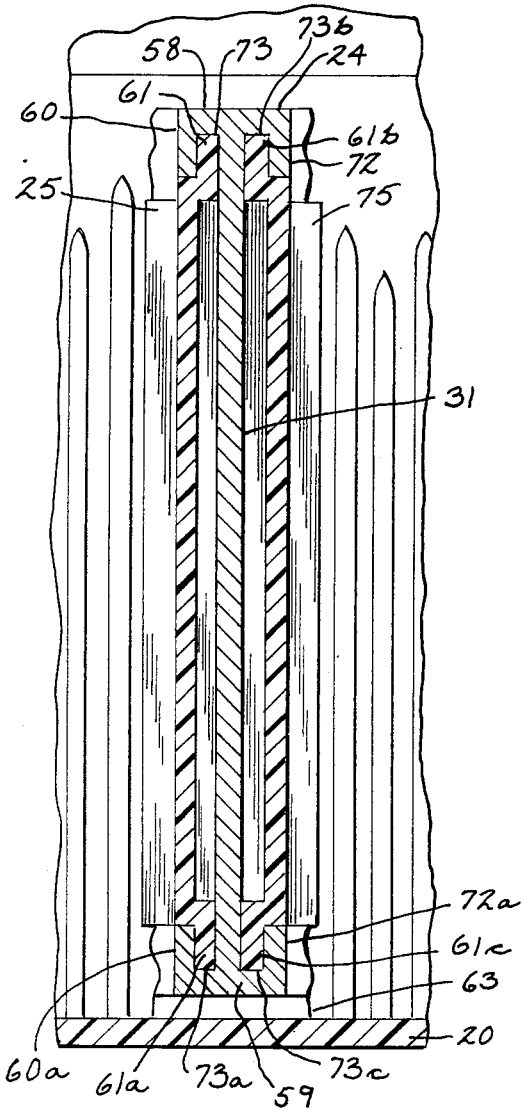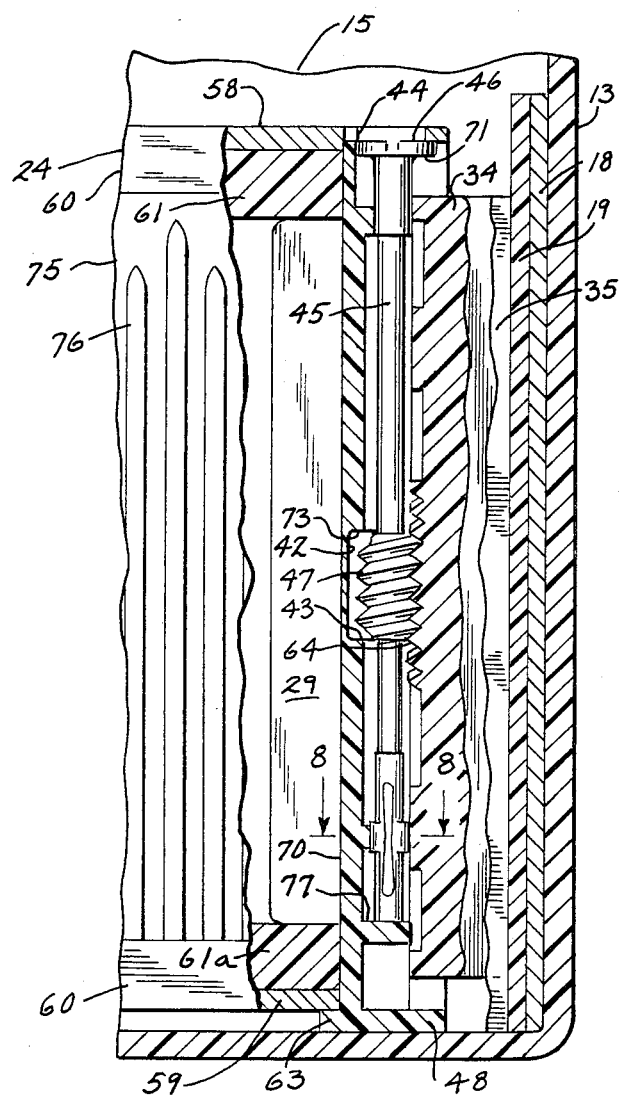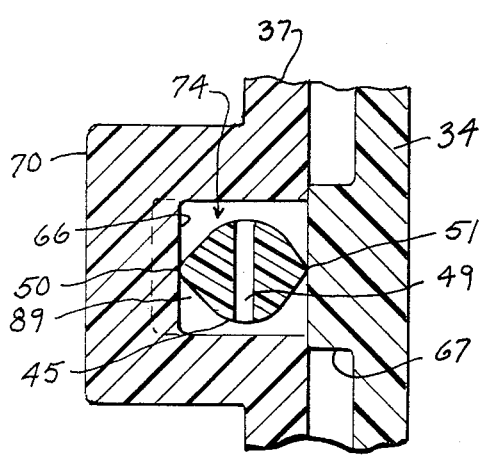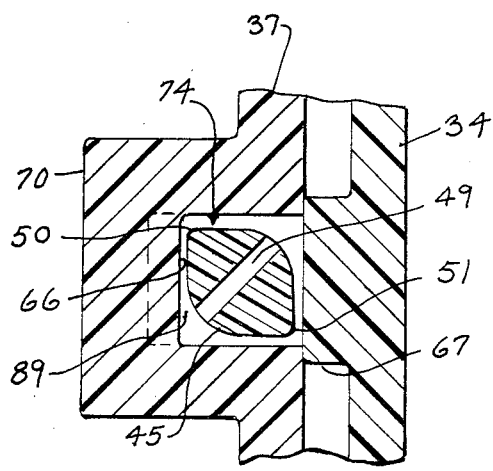
FIG. 6
FIG. 7
FIG 8
FIG. 9

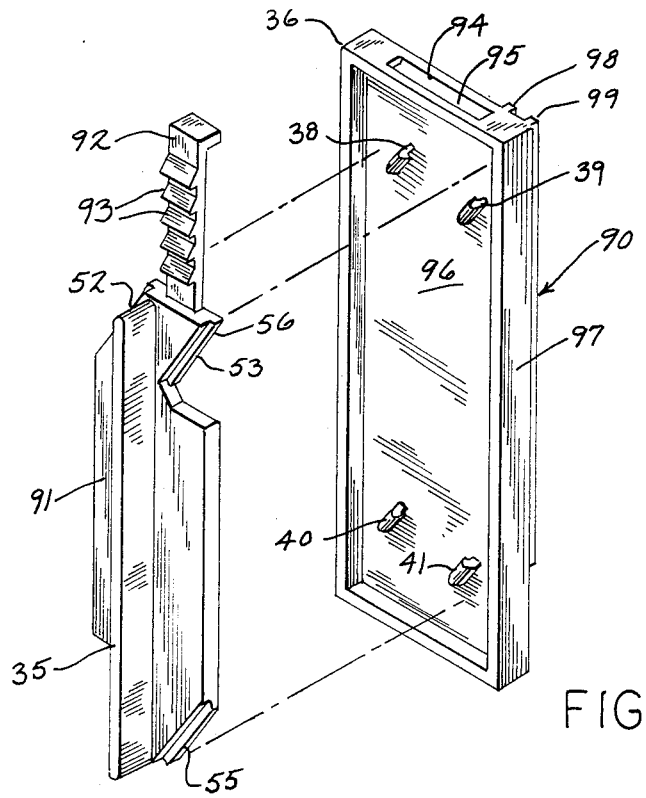
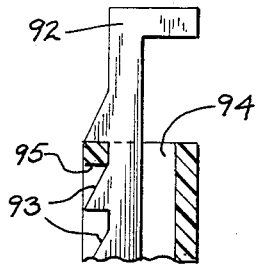
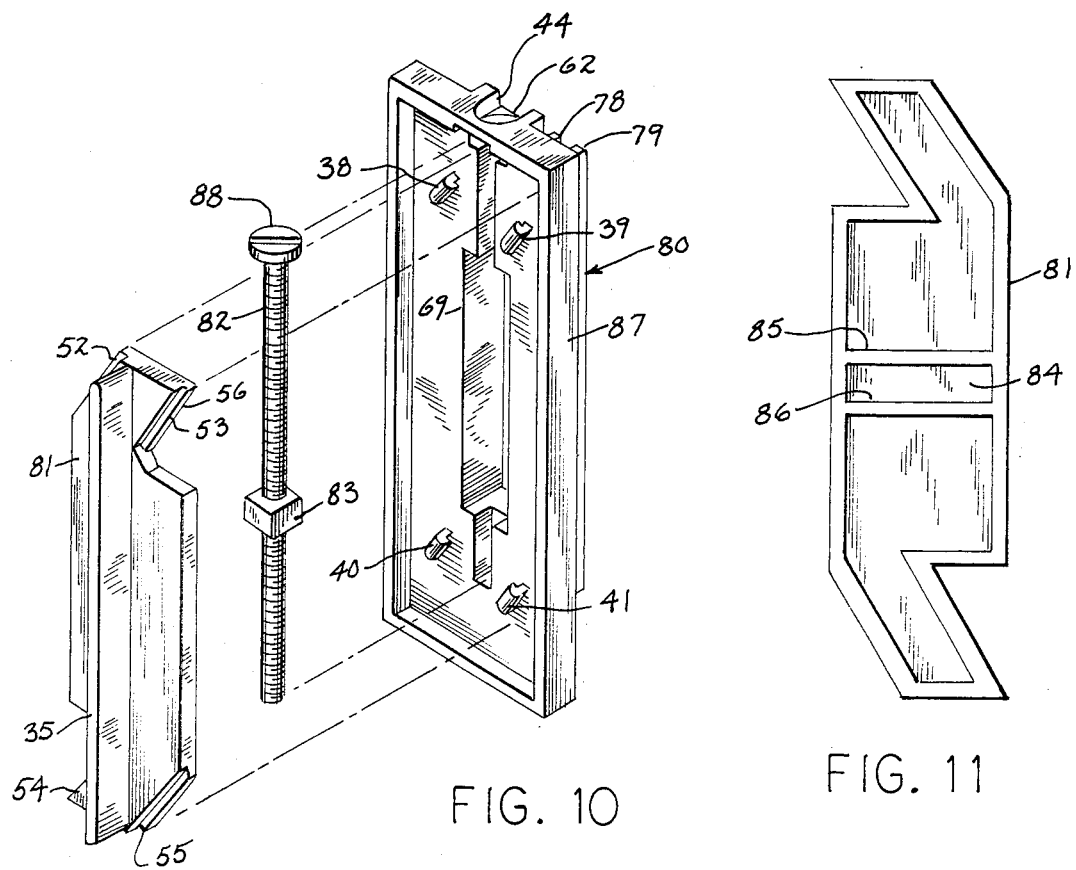
FIG. 12
FIG. 13
FIG. 10
FIG. 11

ADJUSTABLE CIRCUIT BOARD HOLDER ASSEMBLY

BACKGROUND OF THE INVENTION

This invention relates to a holder assembly for printed circuit boards such as those used in conjunction with tote boxes for automatic handling. More particularly, the invention relates to an adjustable circuit board holder assembly which is used as a divider in a tote box and can be infinitely adjusted to facilitate the robotic selection and handling of printed circuit boards.

Holding members for printed circuit boards in the form of clamping devices are known such as indicated in U.S. Pat. No. 3,767,058. Circuit board retainers are also described in U.S. Pat. No. 3,845,359 wherein compression screws are utilized in conjunction with springs for holding the circuit board. In U.S. Pat. No. 4,184,599 a storage device for holding a plurality of printed circuit boards between two movable type portions is provided. An adjustable circuit card retainer is described in U.S. Pat. No. 4,462,499 wherein a card retaining bracket is placed in slidable communication with a mounting bracket so that it is adjustable with respect to the card.

The positioning of printed circuit boards for robotic handling is described in U.S. Pat. No. 4,527,222, which is commonly assigned. In this particular patent, an insert in the form of a frame is placed in the tote box so as to provide precise locating of the printed circuit boards in the frame holding device.

The prior art does not provide a circuit board holder which can effect incremental adjustment of a printed circuit board for robotic handling. In certain instances, the prior art is either concerned with devices for connecting or storing printed circuit boards in box-like containers. In the instance where an adjustable circuit board holding device is afforded for the robotic handling of the printed circuit boards, it does not provide for incremental adjustment of the printed circuit board.

It is an advantage of the present invention to provide a printed circuit board holding device which is incrementally adjustable for use in conjunction with robotic handling.

It is another advantage of this invention to provide an adjustable circuit board holder of the foregoing type which can be employed in conjunction with standard tote boxes.

It is yet another advantage of this invention to provide an adjustable circuit board holder of the foregoing type which allows for a simple and quick adjustment of divider devices to fit various size circuit boards in a snug manner.

It is still another advantage of this invention to provide an adjustable circuit board holder of the foregoing type wherein the holders are of a uniform dimension so that inventory costs are reduced and usage is simplified.

Other advantages of this invention are an adjustable circuit board holder of the foregoing type which can be manufactured at low cost from readily available materials and can be easily assembled.

SUMMARY OF THE INVENTION

The foregoing advantages are accomplished and the shortcomings of the prior art are overcome by the present adjustable mounting device which includes a first member adapted for placement in contact with a wall surface of a container. Means are operatively associated with the first member and the wall surface to restrict movement of the first member in a first direction. A second member is adapted for connection with a holding member for articles to be placed in the container. Means are operatively associated with the first and second members to effect the movement of the second member with respect to the first member when the first member is restricted in movement in the first direction. In one embodiment the means to effect the movement of the second member with respect to the first member includes in part threadable engagement means and in another embodiment a ratchet means. Guide means are operatively associated with the first and second members to effect the movement of the second member in the first direction. In a preferred manner, two of the mounting devices are utilized in conjunction with a circuit board holder box with the box having opposing walls with slots therein. The first member has a flange for placement in one of the slots and the second member is connected to a circuit board holder. Also preferably, the threaded engagement means is afforded by a gear rack disposed on a wall portion of the first member and a rotatable gear is disposed on a rotatable shaft for engagement with the gear rack. The shaft is rotatably connected to the second member and there are guide means provided by the guide surfaces disposed on the first and second members to effect the desired movement of the printed board circuit holder. In still other preferred embodiments, the rotatable shaft is connected to the second member by means of a detent arrangement and the second member has a wall portion with a compartment therein to accommodate the portion of the rotatable gear. Also in a preferred manner, the guide surfaces are provided by slide surfaces on the first member and engaging tab members on the second member. The slide surfaces and the tab members are disposed at an oblique angle with respect to the holding flange for the first member.

BRIEF DESCRIPTION OF THE DRAWINGS

A better understanding of the present adjustable circuit board holder assembly will be accomplished by reference to the drawings wherein:

FIG. 1 is a top perspective view of two of the adjustable mounting devices as they are positioned in a tote box.

FIG. 2 is a partial top plan view and partially in horizontal section illustrating the mounting devices of this invention with the circuit board positioned therebetween.

FIG. 3 is a top perspective view showing one of the adjustable mounting devices attached to the circuit board holder member which is partially shown.

FIG. 4 is a perspective view illustrating the back of the end cap component shown in FIG. 3.

FIG. 5 is a view similar to FIG. 3 showing the assembly of the adjustable mounting device.

FIG. 6 is a view in vertical section taken along line 6—6 of FIG. 2.

FIG. 7 is a view in vertical section taken along line 7—7 of FIG. 2

FIG. 8 is a view in horizontal section taken along line 8—8 of FIG. 7.

FIG. 9 is a view similar to FIG. 8 showing a different position for the detent mechanism.

FIG. 10 is a view similar to FIG. 5 illustrating an alternative embodiment.

FIG. 11 is a view in side elevation showing the back of the end cap component of FIG. 10.

FIG. 12 is a view similar to FIG. 5 showing yet another alternative embodiment.

FIG. 13 is a partial view in vertical section showing the latching mechanism of FIG. 12.

DESCRIPTION OF THE PREFERRED EMBODIMENT

Proceeding to a detailed description of the present invention, the circuit board holder assembly includes two of the mounting devices shown at 10 in FIG. 1 positioned in a tote box generally 11. The tote box 11 in this instance has the usual front wall 12, a back wall 13, side walls 14 and 15 as well as a bottom wall 20. It also has a bumper rim 16. This particular tote box is the subject matter of U.S. Pat. No. 4,499,997, which is commonly assigned.

Referring to both FIGS. 1 and 2, it is seen that the circuit board holder face 17 is positioned against the side wall 15 and another similar but longer circuit board holder face 18 is positioned against the back wall 13. They are also secured to the inside of front wall 12 as well as side wall 14 such as by means of sonic welding. In each instance, the circuit board holder faces 17 and 18 will have an upper rail portion such as shown at 30. Each of the holder assemblies 10 include a divider plate 24 which receives the opposing circuit board holder faces 25 and 75 on each side thereof. This divider plate will secure the circuit board holder faces 25 and 75 in a manner to be later described in conjunction with FIG. 6. The circuit board holder faces 25 and 75 have the slots 26 and 76 therein for receiving the printed circuit boards such as 22 and 23. The holder assemblies 10 include an end cap body 27 having the flanges 28 and 29 which are receivable in the slots 32 and 33 of the divider plate member 24. These slots 32 and 33 are formed from a spacing between the circuit board holder faces 25, 75 and a central panel section 31 (See FIGS. 4 and 5). The divider plate 24 will be retained in the slotted wave form 19 of front and back wall circuit board holder faces 18 by the end cap slide 34 having the flange 35 retained in the slots 21. This is best seen in conjunction with FIG. 2.

Turning to FIGS. 3-5, as each of the holder assemblies 10 is the same only one is described in detail. The end cap slide 34 is slidably retained in a frame 36 composing a part of the end cap body 27 which also has the support wall 37. Projections 38, 39, 40 and 41 extend outwardly from the support wall 37 and have the engagement surfaces such as 57 for slidable engagement along the guide ways 52, 53, 54 and 55 of the end cap slide 34. The support wall 37 has a longitudinally extending slot 69 for receiving the drive shaft 45 as well as a compartment 42 with a support wall 43 for accommodating the screw threads 47 of the shaft 45. A slotted head portion 46 extends from shaft 45 which has the intermediary screw threads 47. Connected to shaft 45 is a slotted portion 49 with two protrusions 50 and 51 extending outwardly and transversely with respect to the slot 49. These serve as part of a detent mechanism as will be further explained in conjunction with the description of FIGS. 8 and 9. The end cap body also has a recess 44 at the top as well as an associated wall portion 62 for receiving and providing support to the circular flange 71 of the drive shaft 45. As best seen in FIG. 4 end cap slide 34 has a rib 67 extending diagonally over the back thereof. This serves as part of the detent mechanism which is described in conjunction with FIGS. 8 and 9.

Referring to FIG. 6, it is seen that the circuit board faces 25 and 75 are held in the divider plate 24 having the opposing T-shaped heads 58 and 59. Flanges 60, 60a and 72, 72a are spaced from the central panel 31 to afford slots or tracks 73, 73a, 73b and 73c so as to receive the inset flanges 61, 61a, 61b and 61c of the circuit board holder faces 25 and 75.

As best seen in FIG. 7, end cap slide 34 includes a threaded rack 64 extending from the rear thereof and opposite the flange 35. The threaded rack 64 engages the screw threads 47 on the drive shaft 45 as positioned in the compartment 42. The threads 47 will be held captive in the compartment 42 by the wall surfaces 43 and 73. In this position, the flange 71 is accommodated in the recess 44 and rests on the wall 62. (See FIG. 5) At the opposing end, the drive shaft 45 rests on the support wall 77, which is an extension of a back wall portion 70 of the end cap body 27. An extending foot portion 48 provides a standoff which serves to stabilize the holder assembly 10 in the tote box 11 and a heel portion 63 provides a support for head 59 so as to space the holder assembly 10 above the bottom wall 20. This compensates for any warping of the bottom wall.

As best seen in FIGS. 8 and 9, a detent mechanism, generally 74, is afforded for the drive shaft 45. This is accomplished by a U-shaped compartment 89 formed by a U-shaped wall portion 70 extending from the back of support wall 37 and the protrusions 50 and 51 extending from the drive shaft 45. These protrusions 50 and 51 engage the projection 66 extending from wall portion 70 as well as rib 67 extending from the back of end cap slide 34. This detent mechanism aids in avoiding undesired turning of the shaft 45 such as during shipping. When projections 50 and 51 are in the position shown in FIG. 9, shaft 45 cannot be rotated without a force being applied. When a rotative force is applied, projections 50 and 51 engage projection 66 and rib 67 with a compression of slot 49. This effects sufficient resistance until the projections 50 and 51 are again diagonally positioned.

An alternative embodiment of the holder assembly is shown in FIGS. 10 and 11 designated generally 80. The end cap slide 81 is similar to end cap slide 34 except that on the reverse side it has two parallel ribs 85 and 86 for capturing the nut 83 in the slot 84 when the nut 83 and the bolt 82 are positioned in the slot 69 with nut 83 slidably received therein. In this instance, end cap body 87 is similar thereto and has the recess 44 and the wall 62 for supporting the head 88 of the bolt 82. In other respects, embodiment 80 is similar to the previously described embodiment 10 in that end cap slide 81 has the flange 35 for retention in the slots 21 of the wave form 19. It is also slidably received by the end cap body 87 with the previously described projections 38-41 engaging the guide ways 52-55 having the undercuts 56. Flanges 78 and 79 extend from the back of the end cap body 87 for receiving a divider plate 24 in the same manner as described for flanges 28 and 29 of the end cap body 27.

Referring to FIGS. 12 and 13, an additional embodiment 90 is depicted. This embodiment differs from the previous one in that instead of a threaded engagement means for moving end cap body 97 laterally relative to the end cap slide 91 there is a ratchet mechanism represented by the arm 92 extending from the end cap slide 91 having the grooves 93. This arm 92 is biased in a manner to engage the wall 95 provided in the opening 94 in the end cap body 97 which also is of a rectangular frame structure 36. It will also be noted that the support wall 96 of end cap body 97 does not have a slot but does have the same projections 38-41 for engaging the slides such as 52, 53 and 55 and their undercuts 56. It also has the flanges 98 and 99 for receiving the divider plate 24.

Operation

The holder assembly 10 will be better understood by description of its fabrication and operation. The assembly of the holder assembly generally 10 is best indicated in conjunction with FIG. 5. Specifically, the unit is composed of four parts: the end cap slide 34, the drive shaft 45, the end cap body 27 and the divider plate 24. The drive shaft 45 will be aligned and inserted through the slot 69 with the shaft 45 seated in the end cap body 27 as shown in FIG. 7. This will be initially effected by positioning the shaft 45 at a steep angle with respect to end cap body 27 so the slotted head 46 can be inserted through opening 63 leading into the recess 44. The next step is to slidably position the undercuts 56 on the guide ways 52-55 of the end cap slide 34 so as to press fit them together with the engagement surfaces 57 of the projections 38-41. In this position, the threads 47 of the drive shaft 45 engage the threaded rack 64 of the end cap slide 34. Also in this position the end cap body 27 is ready to engage the divider plate 24 or holding member. This is effected by positioning the flanges 28 and 29 into the slots 32 and 33 of the divider plate 24. Next is to place two of the holder assemblies 10 into the box 11 and between the circuit board holder faces 18 which are positioned on the inside of the walls 12 and 13. This is effected by placing the extending flanges 35 into the adjacent slotted wave form 19.

It will be appreciated that the widths of circuit boards such as 22 and 23 will vary from each other so that the adjustment to receive their end edge sections in the slots such as 26 and 76 is critical. To adjust for these variations in widths, all that is required is a turning of the drive shaft 45. This would ordinarily cause the end cap 34 to move in an angular manner with respect to the end cap body 27 through the engagement of the screw threads 47 and threaded rack 64. However, the following factors must be considered. The flange 35 is now held in the circuit board holder face 18 and in the wave form 19 so that lateral movement is prevented. Also, the factor that the guide ways 52-54 as well as the projections 38-41 are positioned at an oblique angle with respect to the flange. These factors will cause lateral and angular motion of the end cap body 27 with respect to the flange 35 and the front and back walls 12 and 13. This lateral motion will then allow the divider plates 24 to move toward or away from the circuit boards 22 and 23 for adjustment purposes. It will be appreciated that while lateral motion of the end cap bodies 27 is effected with respect to the flanges 35, they are held stationary with respect to lateral motion, some upward and downward motion of the end cap slide 34 is effected. However, the lateral motion of the end cap bodies 27 is effected due to the previously described oblique angle of the guide ways 52-55 and the projections 38-41. This upward or downward motion will not be a factor as to the divider plates 24 and the circuit boards 22 and 23 which are positioned on the heel 63 of the end cap body 27 by their own weight and will not be raised or lowered. In the event the circuit boards 22 and 23 and the holder faces 25 and 75 should attempt to be raised, a slight force on the tops of circuit boards 22 and 23 will cause them to be released from the holder faces and positioned against the heel 63 of the end cap body 27 or the bottom wall 20 in the absence thereof.

The operation of embodiments 80 and 90 is substantially the same as previously described for embodiment 10. The same lateral motion of the end cap bodies 87 and 97 will be effected when the flanges 35 are restrained from lateral movement in the slots 21 of the wave form 19. In the instance of the embodiment 80 the turning of the bolt 82 with the capture of the nut 83 in the end cap slide 81 will effect the lateral movement of the end cap body 87 and the divider plates 24. In the instance of the embodiment 90, a movement of the rachet arm 92 inwardly or outwardly with respect to the end cap body 97 will effect the same lateral motion of the end cap body 97 and the divider plates 24.

The preferred materials for injection molding of the end cap slides 34, 81 and 91, the drive shaft 45, the bolt 82 and the nut 83 as well as the end cap bodies 27, 87 and 97 is an acetal plastic. However, other plastic materials such as nylon or A.B.S. can be employed. In this instance, the circuit board holder faces 25 and 75 are molded from a polypropylene material whereas the divider plate 24 is extruded aluminum. Other lightweight plastic and metal materials could be substituted.

A slotted head 46 is provided on the shaft 45. This affords engagement with a screw driver. If desired, a slotted tab could be substituted for finger engagement with a portion of the tabs being removed to provide a slot for a screwdriver.

In the foregoing description, the detent mechanism is employed in conjunction with the protrusions 50, 51 and the slot 49. While this feature is advantageous in preventing the screw threads 47 from turning during transportation, this feature could be eliminated and still obtain the advantages of the device for this invention. A compartment 42 is provided for the threads 47 and allows for expansion therein should the end cap slide be forced against a restraining surface such as the bottom wall 20 of the tote box 11 or a surface of the end cap body. This also could be eliminated. An oblique angle of approximately 30° is preferred for the slide guide ways 52-55. Any angle which will afford a lateral movement of the end cap body 27 could be utilized. While the holder device 10 has been shown in conjunction with a facing board 25 on each side of the holder 24. This is not essential and the advantages of this invention could be accomplished with only a single facing board being employed on one side. Also, while two holder devices have been illustrated, some of the advantages of this invention could be accomplished by using a nonadjustable divider holder panel in combination with an adjustable one.

It will thus be seen that through the present invention there is now provided a holder assembly for circuit boards which is infinitely adjustable and thus lends itself to robotic handling. The holder assemblies provide for fast and efficient placement in the container as well as versatility in accommodating various types of facing board holders. The holder assemblies of this invention are adaptable to being utilized as adjustable divider plates allowing for simple, quick adjustment of the dividers to accommodate various widths of circuit boards snugly with a single divider plate. The holder assemblies are of uniform construction thus reducing inventorying of different assemblies.

I claim:

1. An adjustable mounting device adapted to be connected to a wall surface of a container box and a holding member for holding circuit boards or the like so as to provide for incremental adjustment of the holding member comprising:
   a first member adapted for placement in contact with said wall surface of said container;
   means extending from said first member for engagement with said wall surface to restrict movement of said first member in a lateral direction;
   first guide way means extending from said first member;
   a second member adapted for connection with said holding member for articles to be placed in said container;
   second guide way means extending from said second member; and
   screw thread means operatively associated with said first and second members, said screw thread means and said first and second guide way means constructed and arranged to effect movement of said second member in a lateral direction when said first member is restricted in movement in said lateral direction 2. The invention according to claim 1 wherein said screw thread means is defined in part by a screw threaded drive shaft captively held by said second member and a threaded rack extending from said first member.

3. The invention according to claim 1 wherein said means to effect movement of said second member with respect to said first member is defined in part by a ratchet means.

4. An adjustable holder assembly adapted to be inserted into a circuit board holder box having opposing walls with slots therein, the holder assembly adapted to be connected to a holding member for circuit boards so as to provide for incremental adjustment of the holding member, comprising:
   two mounting devices each comprising:
   a first member having a flange for placement in one of said slots;
   first guide way means extending from said first member;
   a second member connected to said circuit board holding member;
   second guide way means extending from said second member;
   screw thread means operatively associated with said first and second members, said screw thread means and said first and second guide way means constructed and arranged to effect movement of said second member with respect to said first member in a lateral direction 5. The invention according to claim 4 wherein said screw thread means is defined in part by a screw threaded drive shaft captively held by said second member and a threaded rack extending from said first member.

6. The invention according to claim 4 wherein said means to effect movement of said second member with respect to said first member is defined in part by ratchet means.

7. The invention according to claim 5 wherein said first member includes a wall portion and said screw threaded drive shaft is defined by a rotatable gear disposed on a rotatable drive shaft for engagement with said gear rack, said drive shaft rotatably connected to said second member and said guide way means is defined by guide surfaces disposed on said first and second members.

8. The invention according to claim 7 wherein said rotatable drive shaft is rotatably connected to said second member by means of a detent mechanism.

9. The invention according to claim 7 wherein said second member defines a wall portion with a compartment therein to accommodate a portion of said rotatable gear.

10. The invention according to claim 9 wherein said second member further includes a slot portion to accommodate a mounting of said drive shaft therein.

11. The invention according to claim 10 wherein said drive shaft includes an engagement portion and said second member includes a support surface for said engagement portion and a support surface for said drive shaft.

12. The invention according to claim 11 wherein said slot portion is in open communication with said support surfaces.

13. The invention according to claim 7 wherein said guide surfaces are defined by said surfaces on said first member and engaging tab surfaces on said second member.

14. The invention according to claim 7 wherein said guide surfaces are disposed at an oblique angle with respect to said flange.

15. The invention according to claim 4 wherein said two mounting devices are placed in a standard tote box.

16. The invention according to claim 5 wherein threadable engagement means is defined by a slot in said second member, a nut slidably received in said slot and a bolt rotatably positioned in said second member and operatively connected with said nut.

17. The invention according to claim 6 wherein said ratchet means is defined by a biased arm member with grooves extending upwardly from first member and an opening in said second member having a wall surface to engage said grooves.

18. The invention according to claim 4 further including support means extending from said first member to space said second member above a bottom wall thereof.

* * * * *